Sept. 7, 1965 B. BIRKENES 3,205,444
AUTOMATIC GAIN CONTROL CIRCUIT WITH SIGNAL OVERLOAD PREVENTION
Filed Oct. 19, 1962
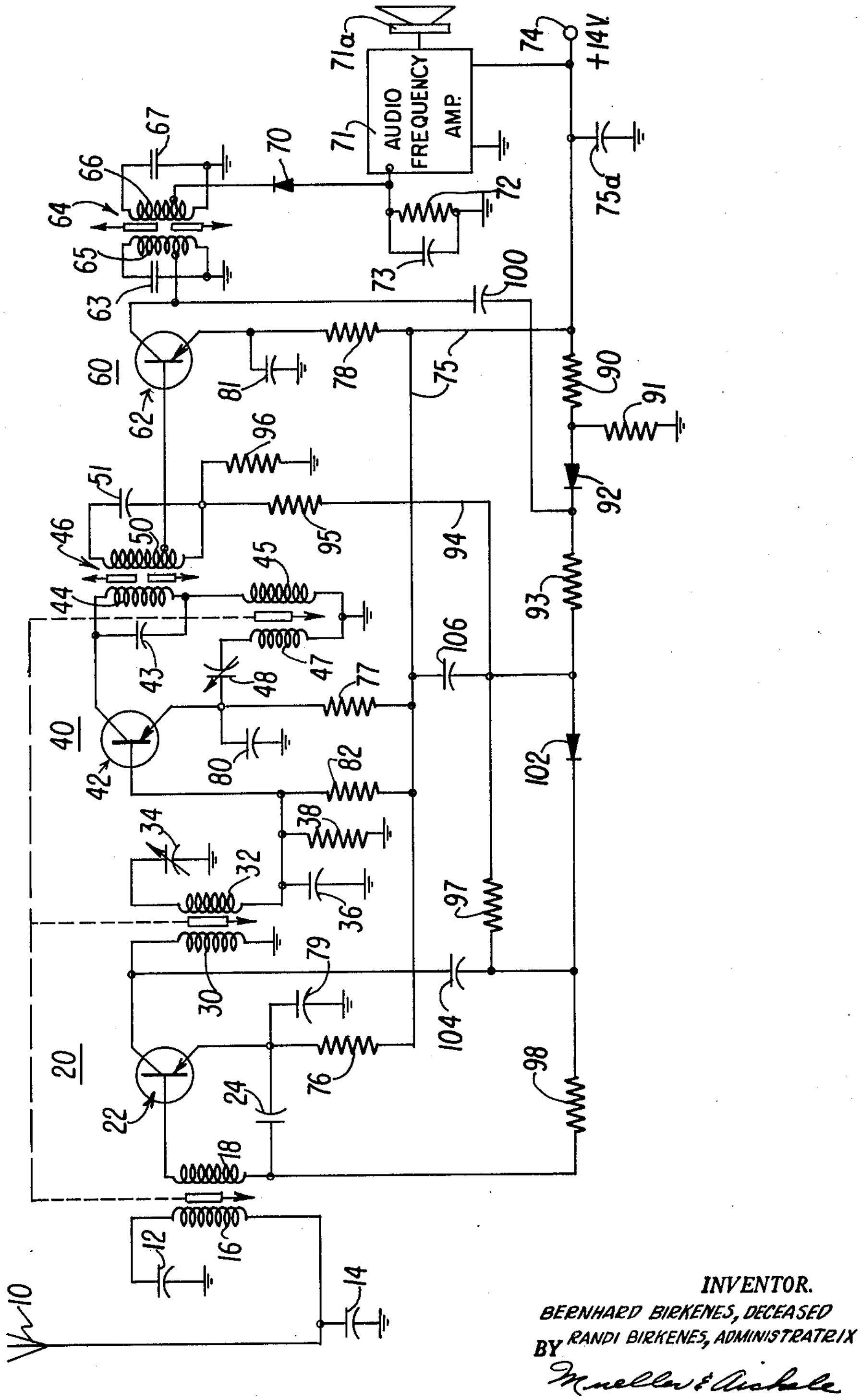
INVENTOR.
BERNHARD BIRKENES, DECEASED
BY RANDI BIRKENES, ADMINISTRATRIX
Mueller & Aichele
ATTYS.

3,205,444
Patented Sept. 7, 1965

3,205,444

AUTOMATIC GAIN CONTROL CIRCUIT WITH SIGNAL OVERLOAD PREVENTION

Bernhard Birkenes, deceased, late of Chicago, Ill., by Randi Birkenes, administratrix, Chicago, Ill., assignor to Motorola Inc., Chicago, Ill., a corporation of Illinois Filed Oct. 19, 1962, Ser. No. 231,869
8 Claims. (Cl. 325—404)

This invention relates to radio receivers and more particularly to transistorized receivers having improved automatic gain control and radio frequency circuits to minimize receiver overloading.

Most present day receivers have a tuned network, often double tuned to select and couple incoming signals received at the antenna to the initial amplification stage of the receiver. Because of inherent low impedance operation of transistors, it is difficult to provide networks of the desired selectivity without resorting to complex, multiple tuning arrangements. Strong signals of an unwanted frequency can pass through the tuned network to introduce a voltage at the input of the radio frequency amplifier. This unwanted signal may then be amplified and fed to the converter stage to introduce objectionable spurious responses which pass through the receiver. In addition, strong signals, including those of both wanted and unwanted frequencies, tend to overload the receiver, causing distortion and requiring automatic gain control systems having an exceptionally high loop gain.

These spurious responses and strong signal overload conditions produce troublesome problems in portable receivers, and particularly in receivers for use in automobiles, where the set is frequently moved into areas where very strong adjacent channel signals exist. It is desirable in transistorized receivers to reduce spurious responses and overload caused by such signals while at the same time reducing the number and complexity of circuit components so that full advantage of space saving transistorization can be realized.

Known prior art automatic gain control systems operate to reduce the overall gain of the receiver in response to the total signal appearing at a later stage in the receiver. No differentiation is made between wanted and unwanted signals, and even though the gain of the receiver is reduced in strong signal areas, controlling the AGC system of the relative strength between wanted and unwanted signals passing through the receiver remains the same. Therefore, strong untuned signals appearing in the receiver are not effectively eliminated by prior art automatic gain control systems. These high level signals place heavy demands on the converter and the automatic gain system of the receiver, resulting in overloads with accompanying distortion and loss of selectivity.

In addition, loading of the radio frequency amplifier stage by strong signals tends to decrease the selectivity of the tuned circuit conventionally used to couple the radio frequency stage to the converter stage. Since this decrease in selectivity occurs when high selectivity is most needed, it is desirable to provide isolation between the tuned coupling circuit and the output of the radio frequency amplifier stage to make the selectivity of such circuit less sensitive to loading conditions of the radio frequency transistor.

Accordingly, it is an object of the present invention to reduce overloading caused by strong untuned signals in a transistorized receiver by means of simple and inexpensive circuitry.

A further object of the invention is to provide improved coupling between the radio frequency amplifier stage and the converter stage of a transistorized radio receiver.

A still further object of the invention is to provide improved selectivity characteristics in a transistorized receiver without the use of additional tuned networks in the input stages of the receivers.

A feature of the invention is the provision of an improved automatic gain control system having an auxiliary gain control signal detector responsive to signals other than those to which the coupling network between the radio frequency amplifier stage and the converter stage are tuned to reduce the gain of the radio frequency stage in the presence of such signals to prevent them from overloading the converter.

Another feature is the provision in a radio receiver of an automatic gain control system having two gain control signal detectors, one primarily responsive to high level signals of a frequency other than a preselected frequency to control the gain of the radio frequency amplifier stage, and the other responsive to the total signals passed through the receiver to keep the overall sensitivity constant.

A further feature of the invention is the provision in a radio receiver of a radio frequency transistor amplifier stage having a signal tuned circuit connected to an input electrode and a tuned output circuit to couple the output electrode to the converter stage. The tuned output circuit is loosely coupled to the output electrode of the radio frequency amplifier stage to minimize the loading effects of the said transistor on its selectivity in the presence of strong signals.

Still another feature of the invention is the provision of an auxiliary AGC circuit for the radio frequency amplifier stage of a radio receiver, which circuit further provides a degenerative feedback path between the output collector electrode and the input base electrode of the tuned radio frequency stage of a transistorized receiver so that strong signals of an unwanted frequency are prevented from overloading the converter of the receiver.

The drawing shows a schematic diagram of a radio receiver incorporating the present invention.

In a particular form of the invention the gain control system of a radio receiver utilizes two control diodes. A first diode controls the quiescent bias potential to the base electrode of both the radio frequency and the intermediate frequency amplifiers in response to the total signal appearing at the output of the intermediate frequency amplification stage. In addition, a second diode controls a bias voltage whenever a strong signal occurs at the output collector electrode of the radio frequency amplification stage. This bias voltage is also applied to the input base electrode of the radio frequency transistor and operates to lower the sensitivity of this stage in the presence of strong signals of an unwanted frequency. The reduced sensitivity also affects the total incoming signal, as controlled by the first diode, and that diode responds accordingly to increase the sensitivity of the intermediate frequency stage so that the overall sensitivity of the receiver remains constant. To further enhance selectivity in the presence of strong signals, the output collector electrode of the radio frequency amplifier stage is loosely coupled to a sharply tuned circuit translating the selected radio frequency signal to the converter stage. This loose coupling prevents frequency shift and reduced selectivity in the tuned circuit with impedance changes that are caused by loading of the radio frequency transistor amplifier.

A specific embodiment of a receiver employing the gain control system and the radio frequency coupling of the present invention is shown in the drawing. Signals appearing at antenna 10 are selected by a tuned network including capacitors 12 and 14 adapted to be resonant at desired frequencies in the broadcast band with slug tuned inductor 16. Winding 18, tightly coupled to inductor 16, couples the preselected radio frequency signal between base and emitter electrodes of transistor 22 of radio frequency amplifier stage 20 through coupling capacitor 24.

The output of radio frequency amplifier stage 20 is connected to an untuned circuit including inductive winding 30 connected between the collector electrode of transistor 22 and ground. Winding 30 is loosely coupled to a tuned circuit including slug tuned inductor 32 and variable capacitor 34. This loose coupling is preferably achieved by winding a few turns, hereinafter specified, over tuned inductor 32. The slug tuning element of inductor 32 is ganged with that of inductor 16 so that both the input and output side of the radio frequency amplifier transistor 22 may be tuned to a preselected frequency. Capacitor 36, connected between one side of inductor 32 and ground, supplies a signal of this preselected frequency to the input electrode of transistor 42 in converter stage 40. Capacitor 36 is shunted by resistor 38 to provide a voltage division and impedance match for the signal coupled to the input base electrode of converter transistor 42.

Converter stage 40 includes an autodyne type converter wherein a single transistor 42 functions both as a mixer and a local oscillator. The output collector electrode of transistor 42 is connected to primary winding 44 of intermediate frequency transformer 46. Winding 44 and capacitor 43 are tuned to a given intermediate frequency. The other end of this tuned circuit is connected through inductor 45 to a ground reference potential. Tuned inductor 47, closely coupled to inductor 45, forms a resonant circuit with variable capacitor 48, which in turn is connected to the emitter electrode of transistor 42. There is, therefore, a feedback path from the collector of transistor 42 through the tuned primary of intermediate frequency transformer 46 and through inductor 45, coupled to the tuned circuit of winding 47 and capacitor 48, back to the emitter electrode of transistor 42. A feedback signal in this path oscillates at a frequency established by variable capacitor 48 and slug tuned inductor 47. This signal functions as a local oscillator signal and is mixed in transistor 42 with the radio frequency input signal coupled to the input base electrode of the transistor from winding 32. An output intermediate frequency signal resulting from this mixing operation is accordingly applied to the tuned primary 44 of the transformer 46.

The tuned secondary of transformer 46, including winding 50 and capacitor 51, is tapped at a predetermined point to supply an input intermediate frequency signal to transistor amplifier stage 60. The tap point on winding 50 for this signal is selected to provide a load impedance match to the input base electrode of transistor 62 and to prevent overload of this transistor.

The output of transistor 62 of intermediate frequency stage 60 is connected to an impedance matching tap point on tuned primary 65 of a second intermediate frequency transformer 64. Capacitor 63 completes the resonate circuit for the primary of this transformer. An output signal developed across the tuned secondary, including winding 66 and capacitor 67, is connected from a tap point on the winding to detector diode 70. This diode functions as a detector in the conventional manner and supplies a demodulated signal at audio frequencies in the radio receiver to a filter network including capacitor 73 in parallel with resistor 72. Audio frequency amplifier 71 is connected to the high voltage side of this filter network to drive loudspeaker 71*a* in the completed receiver.

A suitable operating potential is applied to terminal 74, and in the case of an automotive receiver may be a 14 volt (nominal) potential from the battery and alternator or generator circuit. This potential is distributed to the transistor stages on lead 75. Terminal 74 is bypassed to ground through filter capacitor 75*a*. Emitter voltage is supplied to stabilizing resistors 76, 77 and 78 for transistors 22, 42 and 62 respectively, while capacitors 79, 80 and 81 provide suitable emitter bypass to establish a high frequency reference point for each of these transistors. A bias voltage to establish the quiescent operating point of converter transistor 42 is supplied to its base electrode through stabilizing resistor 82.

In addition, circuit means are provided to supply a base bias voltage to radio frequency amplifier transistor 22 and to intermediate frequency amplifier transistor 62 to establish the quiescent operating condition of these two transistors. Superimposed upon this bias voltage is an automatic gain control signal to re-establish the quiescent operating condition of each of these transistors and hence their gain in response to changing levels of the signal received at antenna 10. The automatic gain control signal is added in series to the base bias voltage so that there are no shunt circuit paths to load the gain control network and reduce its effectiveness at high signal levels. Further, operation of the AGC system allows the gain of the radio frequency amplifier transistor to be independently changed in response to strong signals appearing at the output of this stage. To this end a voltage at terminal 74, suitably divided by resistors 90 and 91, causes conduction in diode 92. Upon conduction of this diode current is fed through resistor 93, conductor 94 and resistors 95 and 96 to establish at the junction point of resistors 95 and 96 a bias voltage. Connection of this junction point to one side of winding 50 of transformer 46 connects this bias voltage to the base electrode of transistor 62 to thereby establish a quiescent operating point. At the same time, current through diode 102 and resistor 98, connected to one side of winding 18, supply a base bias voltage to transistor 22 to established its quiescent operating point. For any given input signal level to the receiver the gain of transistors 22 and 62 is fixed by the relative magnitude of the voltage supplied to their respective emitter and base electrodes. A change in input signal level causes a corresponding change in the base bias voltages to re-establish the gain in response thereto.

To provide automatic gain control action for the total signal applied to the receiver, capacitor 100 is connected between the cathode end of diode 92 and a tap point on winding 65 of transformer 64. This capacitor is initially charged by current through diode 92 to a voltage proportional to that establishing the quiescent operating condition of transistors 22 and 62. Because of undirectional conduction of diode 92, the charge on capacitor 100 is also changed in response to the signal developed across the tap point on winding 65. This signal in turn is proportional to the total intermediate frequency signal developed in the receiver, and therefore the charge on capacitor 100 is changed in response to the output signal level of converter stage 40. As the charge on capacitor 100 is changed, the conduction of diode 92 changes accordingly, and the bias signal supplied to the base of transistor 62 to establish its quiescent operating point is also changed. In this manner, high level signals appearing across primary winding 65 of intermediate frequency transformer 64 operate to reduce the gain of intermediate frequency transistor so that automatic gain control operation is realized.

The AGC signal superimposed on the bias voltage appearing on lead 94 is also connected to the anode side of diode 102. This diode, shunted by a relatively high value stabilizing resistor 97, conducts to provide a bias potential to the base electrode of transistor 22 to establish its quiescent conductive state in the same manner that conduction of diode 92 biases the base electrode of transistor 62. Changes in the condition of charge on capacitor 100 causing a change in conduction of diode 92 and therefore a change in the potential appearing on lead 94 results in a corresponding change in the voltage applied to the anode of diode 102. The bias signal applied to the base of transistor 22 is accordingly changed in response to the strength of the intermediate frequency signal appearing across the primary of transformer winding 65. Therefore, automatic gain control action is applied in part to radio frequency amplifier stage 20 as a signal superimposed upon the biasing voltage for that stage.

It should be noted that this automatic gain control action is responsive to the total signal appearing in the intermediate frequency stages of the receiver in transformer winding 65. In order to provide independent gain control of radio frequency amplifier stage 20, capacitor 104 is coupled between between the output collector electrode of transistor 22 and cathode of diode 102. Capacitor 104 is initially charged by current through diodes 92 and 102 to the potential appearing at the cathode of diode 102. The charge on capacitor 104 also tends to be changed in response to both wanted and unwanted signals appearing at the collector electrode of transistor 22, resulting in a change in conduction of diode 102 and independent AGC action for radio frequency amplifier stage 20.

Signals of an unwanted frequency apearing at the collector of transistor 22 which are strong enough to be fed through the tuned output of transistor 22 to the input electrode of the converter transistor 42 to cause overloading are relatively much greater in magnitude than signals of a wanted frequency at that point. Since the automatic gain control action initiated by the output transformer of the IF stages is responsive to the total signal level, it does not discriminate between high level signals of an unwanted frequency and signals of a wanted frequency. However, in a signal area where the presence of strong adjacent channel signals is particularly troublesome, low level wanted signals appearing at the collector of transistor 22 do not appreciably affect the charge on capacitor 104 as developed by the conduction of diode 102. On the other hand, high level unwanted signals, strong enough to be fed through the tuned circuit coupling transistor 22 to converter stage 40, have a much greater effect on the charge of capacitor 104. Such signals are of sufficient magnitude to change the charge on capacitor 104 by an amount that is significant in terms of the voltage developed across diode 102 so that its forward conduction is controlled. Therefore, the presence of strong adjacent channel signals in the radio frequency amplifier stage provide a greater influence on the independent automatic gain control action tending to reduce the sensitivity of this stage than signals of a selected channel frequency. Concurrent with this decrease in RF sensitivity in the presence of adjacent channel signals, there is a decrease in conduction of transistor 22. This decreases the loading, or conversely, increases the impedance presented to the tuned circuit coupling radio frequency signals to the converter stage and results in sharper tuning and a decreased tendency to load the converter in the presence of strong adjacent channel frequencies. In addition to this discriminatory action of the auxiliary automatic gain control circuit, capacitor 104 provides a degree of degenerative feedback through resistor 98 to the input of transistor 22 to further reduce strong signals appearing in amplifier stage 20 which tend to result in overloading converter stage 40.

Since the conduction of diode 92 is responsive to the total signal fed to the intermediate frequency stages, any reduction in wanted signals resulting from the reduction of the sensitivity of amplifier stage 20 is compensated for by corrective action of the overall automatic gain control system. This results in two independent automatic gain control actions, one controlling the conduction of diode 92 and tending to keep the overall sensitivity of the receiver constant, and one controlling the conduction of diode 102 to reduce the sensitivity of the RF stage in the presence of high level signals to reduce the loading effects on converter transistor 42.

To provide for effective filtering for audio as well as higher frequency signals which may appear on the automatic gain control lead 94, a large value filter capacitor 106 is connected between this lead and D.C. potential lead 75. In that the potential difference between these two leads is relatively small, in order of one or two volts as contrasted with approximately 12 volts between either of these leads and a ground reference potential, this type of filtering is relatively insensitive to surges caused by voltage changes appearing at terminal 74, as commonly occur when operating voltages for the receiver are supplied from an automotive electrical system.

In addition to the reduction of the sensitivity of the radio frequency amplifier stage in the presence of signals of an unwanted frequency, selectivity of the receiver is enhanced by the coupling arrangement between the radio frequency stage and the converter. It has been found that by providing a loose coupling between output winding 30 and the tuned circuit including inductors 32 and 34, the selectively of this tuned circuit remains high in the presence of heavy loading of transistor 22. By way of example, a flat winding of approximately 100 turns on a diameter of 0.285 inch, wound over a 170 turn progressive universal winding on a 0.20 diameter form, provides a coupling for the radio frequency signal so that the tuned circuit is not adversely affected by impedance changes in transistor 22. In terms of coupling coefficient, values below 0.1 are adequate, with a coupling coefficient in the order of .005 producing optimum results.

Accordingly, the above described circuit provides a transistorized receiver having improved selectivity for use in portable and mobile applications. The unique automatic gain control circuit and radio frequency coupling circuit reduce spurious responses and distortion caused by strong signal overload. At the same time these circuits are simple and economical, and in particular enable satisfactory performance to be obtained without using a double tuned preselector network coupling the receiver antenna to the input of the radio frequency stage.

What is claimed is:

1. An automatic gain control system for a radio receiver having a radio frequency amplifier stage, a converter stage, and an intermediate frequency amplifier stage, said system including in combination, means for supplying a undirectional current, first circuit means for supplying bias potential to a control electrode of said intermediate frequency amplifier stage, first diode means having a first terminal connected to said unidirectional current supplying means and a second terminal connected to said first circuit means, with said first diode poled to conduct current to said first circuit means to establish the sensitivity of said intermediate amplifier stage, means coupling a portion of the output signal of said intermediate frequency amplifier stage to said first diode to control current therethrough, thereby changing the sensitivity of said intermediate frequency amplifier stage in response to said intermediate frequency signal, second circuit means for supplying bias potential to a control electrode of said radio frequency amplifier stage, second diode means having a first terminal connected to said first circuit means and a second terminal connected to said second circuit means with said second diode poled to conduct current to said second circuit means to establish the sensitivity of said radio frequency amplifier stage, and means coupling a portion of the output signal of said radio frequency amplifier stage to said second diode to control conduction therethrough, thereby changing the sensitivity of said radio frequency amplifier stage in response to said radio frequency signal.

2. An automatic gain control system for a radio receiver having a radio frequency amplifier stage, a converter stage, and an intermediate frequency amplifier stage, said system including in combination, means for supplying a unidirectional current, first circuit means for supplying bias potential to a control electrode of said intermediate frequency amplifier stage, first diode means having a first terminal connected to said unidirectional current supplying means and a second terminal connected to said first circuit means with said first diode poled to conduct current to said first circuit means to establish the sensitivity of said intermediate amplifier stage, means coupling a portion of the output signal of said intermediate frequency amplifier stage to said first diode to control current therethrough, thereby changing the sensitivity of said intermediate frequency amplifier stage in response to said intermediate frequency signal, second circuit means for supplying bias potential to a control electrode of said radio frequency amplifier stage, second diode means having a first terminal connected to said first circuit means and a second terminal connected to said second circuit means, with said second diode poled to conduct current to said second circuit means to establish the sensitivity of said radio frequency amplifier stage, means coupling a portion of the output signal of said radio frequency amplifier stage to said second diode to control conduction therethrough, thereby changing the sensitivity of said radio frequency amplifier stage in response to said radio frequency signal, and frequency selection means coupling the output electrode of said radio frequency amplifier stage to the input electrode of said converter stage, whereby signals of an unwanted frequency large enough to be coupled through said frequency selection means change the conduction of said second diode to reduce the sensitivity of said radio frequency amplifier stage in the presence of such signals, while signals of a wanted frequency are coupled through said intermediate frequency signal, with said intermediate frequency signal changing the conduction of said first diode to maintain overall sensitivity of the receiver constant.

3. The receiver of claim 2 wherein said frequency selection means includes an inductive winding coupled with a coefficient of coupling less than .1 to a tuned circuit so that impedance changes of said radio frequency amplifier stage do not change the selectivity of said tuned circuit.

4. In a wave signal receiver having radio frequency amplification stages and intermediate frequency amplification stages, which stages include a transistor having a variable gain characteristic dependent upon application of a control potential applied thereto with respect to a reference point, the gain control and bias system including in combination, a direct current circuit adapted to supply an energizing potential for the receiver stages with respect to a reference point, first resistor means connected to the transistor of an intermediate frequency stage, second resistor means connected to the transistor of a radio frequency stage, a first rectifier device having a first terminal connected to said direct current circuit and a second terminal connected to said first resistor means, said first rectifier device being poled to be conductive upon energization from said direct current circuit for supplying a relatively fixed bias to the intermediate frequency stage transistor through said first rectifier device and said first resistor means, a second rectifier device having a first terminal connected to said first resistor means and a second terminal connected to said second resistor means, said second rectifier device being poled to be conductive upon energization from said fixed bias supplied to said intermediate frequency stage for supplying a relatively fixed bias to the radio frequency stage transistor through said second rectifier device and said second resistor means, first circuit means including an impedance across which the output signal of said intermediate frequency stages appears with respect to a reference point, and a capacitor means for applying such signal to said second terminal of said first rectifier device to form a detector circuit for said intermediate frequency signal so that a gain control potential variable with respect to the intermediate frequency signal strength is applied through said first and second resistor means to the transistors of the receiver stages, and second circuit means including an impedance across which the output signal of said radio frequency stages appears with respect to a reference point and a capacitor means for applying such signals to said second terminal of said second rectifier device to form a detector circuit for said radio frequency signal so that a gain control potential variable with respect to the radio frequency signal strength is applied through said second resistor means to the transistor of said radio frequency stage in the presence of high level radio frequency signals.

5. In a wave signal receiver having a radio frequency amplifier stage tunable to signals of a selected frequency, a converter stage for converting signals of said selected frequency to signals of a predetermined frequency, tuned circuit means coupling signals of said selected frequency to said converter means, and an intermediate frequency amplifier stage tuned to signals of said predetermined frequency; an automatic gain control system including in combination, means for supplying unidirectional current, first network means for supplying a bias potential to a control electrode of said intermediate frequency amplifier stage, a first rectifier device connected between said current supply and said first bias network and poled to conduct current to said first bias network to thereby establish the sensitivity of said intermediate amplifier stage, impedance means providing a portion of the output signal of said intermediate frequency amplifier stage to control conduction of said first rectifier device to re-establish the sensitivity of said intermediate frequency amplifier stage, second network means for supplying a bias potential to a control electrode of said radio frequency amplifier stage, a second rectifier device connected between said first and second bias networks and poled to conduct current to said second bias network to establish the sensitivity of said radio frequency amplifier stage, and impedance means to provide a portion of the output of said radio frequency amplifier stage to control conduction of said second rectifier device to re-establish the sensitivity of said radio frequency amplifier stage independently of the sensitivity of said intermediate frequency amplifier stage.

6. In a wave signal receiver of the type having a tuned radio frequency amplifier stage and a converter stage, the combination including a signal translating circuit adapted to provide a frequency selective signal path between the output of said amplifier and the input of said converter, said circuit comprising a tunable inductor means, variable capacitor connected between one end of said inductor means and a reference potential, a fixed capacitor connected between the other end of said inductor and said reference potential, with said inductor means and said capacitor means operable to form a tuned circuit at a preselected frequency, means to connect the junction point between said inductor means and said fixed capacitor means to the input of said converter stage, and an inductive winding inductively coupled to said inductor means with a coefficient of coupling less than .1 and connected between the output of said amplifier stage and said reference potential to couple said signal to said tuned circuit so that the selection characteristics of said tuned circuit are not changed by the loading of said amplifier stage.

7. In a wave signal receiver having a radio frequency amplifier stage for translating a received signal, the combination including a transistor having emitter, base, and collector electrodes, first tuned circuit means operable to pass a signal of a preselected frequency to the base electrode of said transistor, a transistorized frequency converter stage including a second tuned circuit resonate at said preselected frequency, and an untuned inductive winding connected between said collector electrode and a reference potential, said inductive winding inductively coupled by a coefficient of coupling less than 0.1 with said second tuned circuit.

8. A wave signal translating circuit for passing a signal of a predetermined frequency, said circuit including in combination, a radio frequency amplifier stage with first transistor means having emitter, collector, and base electrodes, a frequency converter stage with second transistor means having emitter, collector and base electrodes, means selectively coupling a signal between base and emitter electrodes of said first transistor means, and means selectively translating said signal between the collector electrode of said first transistor and the base electrode of said second transistor, said translating means including a tunable inductor means with one end connected to the base electrode of said second transistor, variable capacitor means connected between the other end of said inductor means and a reference potential to form a circuit resonate at said signal frequency, and a coil winding wound over said tunable inductor means to provide a coefficient of coupling less than 0.1 with said tunable inductor means, with one end of said winding connected to the collector electrode of said first transistor and the other end of said winding connected to said reference potential.

References Cited by the Examiner

UNITED STATES PATENTS

| | | | |
|---|---|---|---|
| 2,404,408 | 7/46 | Smith | 325—488 |
| 2,511,014 | 6/50 | Schultz | 325—472 |
| 3,015,726 | 1/62 | De Metrick | 325—318 |

DAVID G. REDINBAUGH, *Primary Examiner.*